United States Patent
Srowik et al.

(10) Patent No.: US 7,274,597 B2
(45) Date of Patent: Sep. 25, 2007

(54) METHOD OF PROGRAMMING OF A NON-VOLATILE MEMORY CELL COMPRISING STEPS OF APPLYING CONSTANT VOLTAGE AND THEN CONSTANT CURRENT

(75) Inventors: Rico Srowik, Dresden (DE); Marco Götz, Radebeul (DE); Giacomo Curatolo, Unterhaching (DE); Nimrod Ben-Ari, Natanya (IL)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 114 days.

(21) Appl. No.: 11/141,255

(22) Filed: May 31, 2005

(65) Prior Publication Data
US 2006/0268611 A1 Nov. 30, 2006

(51) Int. Cl.
*G11C 11/34* (2006.01)
(52) U.S. Cl. .................... 365/185.18; 365/185.28; 365/189.07

(58) Field of Classification Search ........... 365/185.18, 365/185.2, 185.21, 185.22, 185.28, 189.07, 365/189.09
See application file for complete search history.

(56) References Cited

U.S. PATENT DOCUMENTS

| 5,712,815 | A  | * | 1/1998 | Bill et al. ............... 365/185.03 |
| 6,097,639 | A  |   | 8/2000 | Choi et al. |
| 6,396,742 | B1 |   | 5/2002 | Korsh et al. |
| 6,487,116 | B2 | * | 11/2002 | Khan et al. ............ 365/185.11 |

FOREIGN PATENT DOCUMENTS

DE 198 60 506 A1 7/1999

* cited by examiner

*Primary Examiner*—VanThu Nguyen
(74) *Attorney, Agent, or Firm*—Slater & Matsil, L.L.P.

(57) ABSTRACT

A method and arrangement are provided for programming an electrically erasable programmable read-only memory cell capable of storing at least one information bit. The memory cell has a charge-trapping region. According to the invention, during a first period of time, a fixed voltage is applied to the memory cell to inject and store electrical charge in the charge-trapping region. This period of time is followed by second period of time during which a constant current is applied to the memory cell to complete the programming step. By monitoring a change in voltage during the second period of time, a monitoring of a resulting threshold voltage is possible directly during programming.

9 Claims, 3 Drawing Sheets

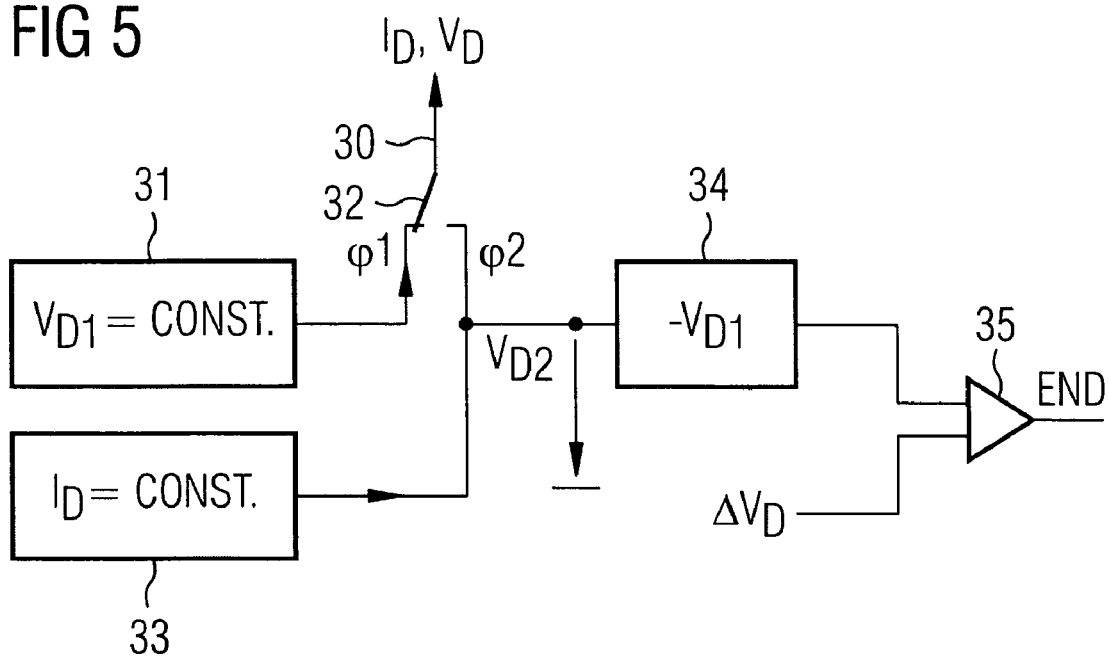
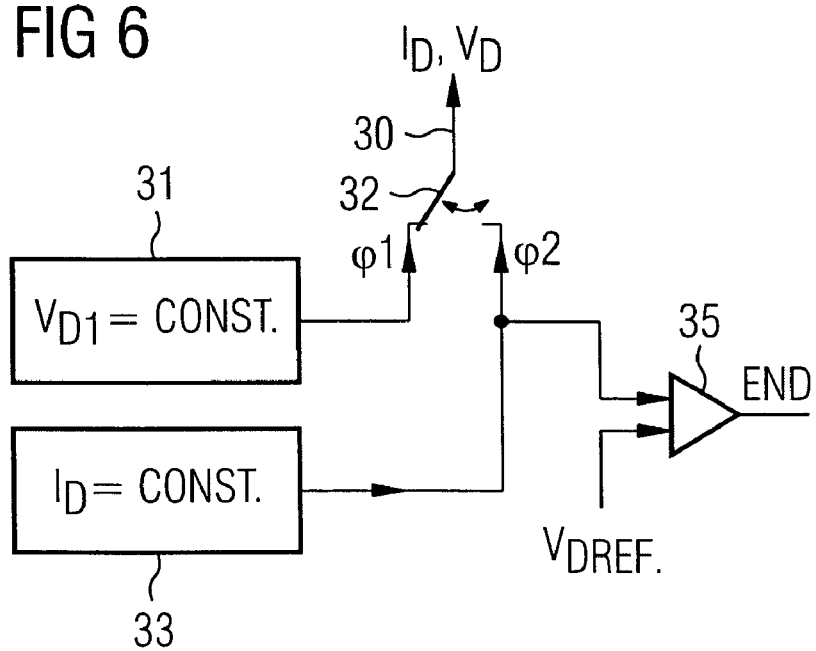

METHOD OF PROGRAMMING OF A NON-VOLATILE MEMORY CELL COMPRISING STEPS OF APPLYING CONSTANT VOLTAGE AND THEN CONSTANT CURRENT

TECHNICAL FIELD

This invention relates to semiconductor memories and, in particular, to the programming of a non-volatile, electrically erasable programmable read-only memory cell.

BACKGROUND

Programming an information bit of a non-volatile electrically erasable programmable read-only memory cell (EEPROM) normally takes a relatively large time. To program a single bit memory cell or a multi-bit memory cell, electrical charge is injected and stored in a charge-tapping region of the memory cell. By injecting and storing, or by non-injecting and non-storing, the electrical charge in the charge-trapping region, a binary information is programmed, which can later be read out of the memory cell.

The programming procedure normally comprises at least two steps, namely in a first step an application of a program pulse, followed by a program verify step in a second step. During the program pulse step, the electrical charge is injected and stored in the memory cell, for example by using the hot electron effect or by using the Fowler-Nordheim tunneling effect. The program verify step allows to test if the programming step was successful or not.

In U.S. Pat. No. 6,396,742 B1, which is incorporated herein by reference, a programming of a memory cell with subsequent verifying is described. There, it is suggested to program a state of a cell and to verify afterwards if the threshold voltage of the cell is within a desired range of voltages. If the desired threshold voltage is not achieved, a predetermined number of additional programming pulses are applied to the cell.

Due to the application of several programming pulses including subsequent verification steps, it takes a relatively large time to program the cell. In addition to this, a trade-off has to be made between the accuracy of the achieved threshold voltage of the memory cell on the one hand, and the amount and resolution of required programming and verification steps on the other hand.

SUMMARY OF THE INVENTION

In one aspect, the present invention speeds up the program time of a non-volatile memory cell. In a further aspect, the present invention allows an adjustment of the threshold voltage of a memory cell during programming. An additional problem solved by embodiments of the invention is to control the distribution of the threshold voltage of a plurality of memory cells.

In accordance with an embodiment of the present invention, a method of programming an electrically erasable programmable read-only memory (EEPROM) cell capable of storing at least one information bit is provided. The memory cell has a charge-trapping region. The method includes the step of programming the information bit by injecting and storing electrical charge in the charge-trapping region, thereby applying a fixed voltage to the memory cell during a first period of time, followed by a second period of time during which a constant current is applied to the memory cell.

According to the method described, a two-phase cell programming is provided comprising a first phase in which a fixed drain voltage is applied and comprising a subsequent second phase in which the programming current is fixed. During the second phase, due to the injected charges, the drain voltage slightly increases.

According to a preferred embodiment, the constant current applied during the second period of time corresponds to the current level reached at the end of the first period of time. Accordingly, at the end of the first period of time, the current flowing at the fixed drain voltage is fixed so that, during the second period of time, a constant current is provided while the voltage of the constant current programming signal is floating.

According to another preferred embodiment of the invention, a change in voltage of a programming signal having the constant current is measured during the second period of time. The voltage of the programming signal having a constant current is dependent on the programming state of the memory cell. The voltage during the second period of time varies, for example, depending on the threshold voltage of the memory cell.

In accordance with a preferred embodiment, the step of programming the information bit by injecting and storing electrical charge in the charge-trapping region is finalized when the amount of voltage change observed during the second period of time exceeds a predefined threshold value. The predefined threshold value may, for example, be dependent upon a desired threshold voltage of the memory cell that the memory cell has after programming. This results in an adjustment of the threshold voltage during programming. The time required for programming is sped up because the step of measuring the actual threshold voltage is no longer required. With the present invention, a self-time concept of the step of programming a non-volatile memory cell is provided.

According to another preferred embodiment, the predefined threshold value is predefined as a function of a desired threshold voltage of the memory cell after programming.

According to another embodiment, the EEPROM cell is capable of storing two bits of binary information and the measurement of the charge trapped in the bit being programmed is performed by measuring the voltage change of the programming signal having a constant current. The bit being programmed is used to monitor the state resulting from the programming of the memory cell directly during the step of programming the memory cell.

According to another preferred embodiment, an arrangement having an EEPROM cell capable of storing at least one information bit is provided, the memory cell having a charge-trapping region, the arrangement comprising a programming signal generator coupled to the memory cell and designed to output, in a first period of time, a programming signal having a fixed voltage, and to output, in a second period of time, subsequent to the first period of time, a programming signal having a constant current, for programming the information bit by injecting and storing electrical charge in the charge-trapping region.

According to a preferred embodiment, in the arrangement, the programming signal generator is designed such that the constant current applied during the second period of time corresponds to the current level reached at the end of the first period of time.

According to yet another preferred embodiment, means are provided to measure, during the second period of time, a change in voltage of the programming signal having a constant current.

It is preferred that the arrangement comprises means to compare an amount of change in voltage in the programming signal having a constant current during the second period of time with a predetermined threshold level, and the arrangement comprising means to finalize the programming of the memory cell, when the amount of change in voltage in the programming signal during the second period of time exceeds the predetermined threshold level.

According to another preferred embodiment, the arrangement comprises a control unit. The control unit produces a control signal to switch between the first period of time and the second period of time. The control unit may comprise means to pre-determine the time interval, which defines a duration of the first period of time.

According to an embodiment of the invention, a method of programming an electrically erasable programmable read-only memory cell is provided capable of storing two binary information bits, the memory cell having a first region connected to a source terminal and a second region connected to a drain terminal, the memory cell having a channel between the two regions and having a gate electrode above that channel but separated therefrom by a charge-trapping region, the charge-trapping region disposed between insulating layers, the method comprising the step of programming a first bit by injecting and storing electrical charge in the charge-trapping region, thereby applying, to the drain terminal and to the gate terminal, a fixed voltage during a first period time, followed by a second period of time during which a constant current is applied to the drain terminal. The gate terminal is at a fixed voltage. The source terminal may be connected to a reference potential terminal.

According to a preferred embodiment, the charge-trapping region sandwiched between the two insulating layers is implemented as an oxide-nitride-oxide (ONO) structure. The memory cell preferably is a two-bit flash EEPROM cell.

Between the two insulating layers, preferably there is provided a non-conducting dielectric layer functioning as the electrical charge-trapping medium. The two individual bits are stored in physically different areas of the charge-trapping region.

According to a preferred embodiment, the constant current applied during the second period of time corresponds to the current reached at the end of the first period of time.

According to another preferred embodiment, during the second period of time, a change in voltage of a programming signal having the constant current is measured by reading the second bit of the memory cell.

According to yet another preferred embodiment, the step of programming the first bit by injecting and storing electrical charge in the charge-trapping region is finalized when the amount of voltage change observed during the second period of time reaches a predefined threshold value.

The predefined threshold value is, according to a preferred embodiment, predefined as a function of a desired threshold voltage of the memory cell.

According to an exemplary embodiment of the invention, an arrangement is provided having an electrically erasable programmable read-only memory cell capable of storing two binary information bits, the memory cell having a first region connected to a source terminal and having a second region connected to a drain terminal, the memory cell having a channel between the two regions and having a gate electrode above that channel but separated therefrom by a charge-trapping region, the charge-trapping region sandwiched between insulating layers, the arrangement comprising a programming signal generator, the programming signal generator coupled to the drain terminal of the memory cell and designed to output, during a first period of time, a programming signal having a fixed voltage and to output, in a second period of time, subsequent to the first period of time, a constant current, the programming signal for programming a first bit of the memory cell by injecting and storing electrical charge in the charge-trapping region. The gate terminal of the memory cell is at a fixed voltage.

The source terminal may be connected to a reference potential terminal. The reference potential terminal may be ground.

The memory cell may comprise an ONO structure with the charge-trapping region being comprised by a non-conducting dielectric layer.

To program the other bit of the two-bit cell, the polarity has to be reversed, that is, the programming signal has to be applied to the source terminal instead of drain terminal.

According to a preferred embodiment, the programming signal generator is designed such that the constant current applied during the second period of time corresponds to the current level of the programming signal reached at the end of the first period of time.

According to another preferred embodiment, the arrangement comprises means to measure, during the second period of time, a change in voltage of the programming signal having a constant current.

According to yet another preferred embodiment, the arrangement comprises means to compare an amount of change in voltage of the programming signal having a constant current during the second period of time with a predetermined threshold level. The arrangement further comprises means to finalize the programming of the memory cell when the amount of change in voltage of the programming signal during the second period of time exceeds a predetermined threshold level.

The following detailed description and the accompanying drawings of exemplary embodiments provide a better understanding of the nature and advantages of the present invention.

BRIEF DESCRIPTION OF THE DRAWINGS

For a more complete understanding of the present invention, and the advantages thereof, reference is now made to the following descriptions taken in conjunction with the accompanying drawing, in which:

FIG. 5 is a first example of a circuit block diagram to generate a programming signal; and FIG. 6 is a second example of a circuit block diagram to generate a programming signal.

The use of the same reference symbols or numerals indicate similar or identical items.

DETAILED DESCRIPTION OF ILLUSTRATIVE EMBODIMENTS

The invention is herein described by way of example only with reference to the accompanying drawings.

Figure 1:
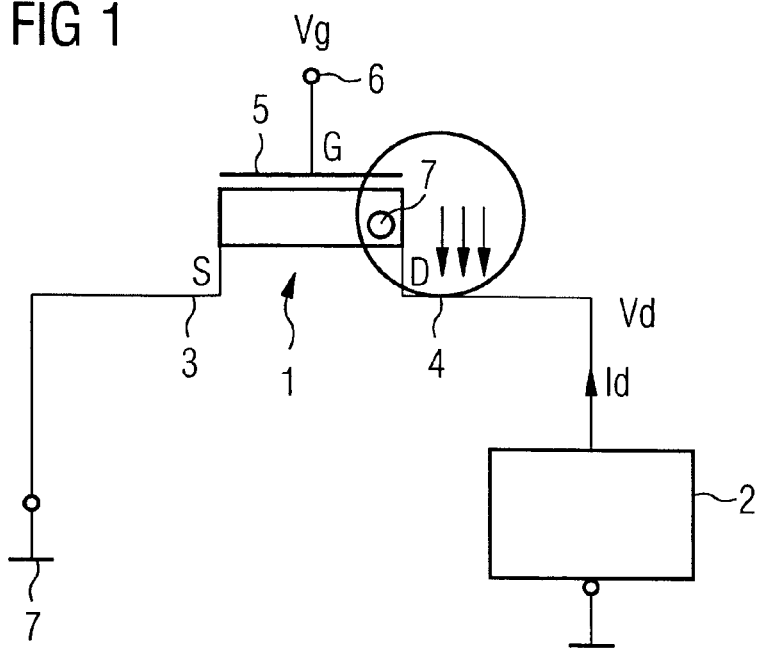
FIG. 1 shows an example of an arrangement having an EEPROM cell and a programming signal generator.

FIG. 1 shows an arrangement having an electrically erasable programmable read-only memory (EEPROM) cell 1 and a programming signal generator 2. The EEPROM cell is capable of storing two binary information bits. The memory cell 1 has a first region coupled to a source terminal 3 and a second region coupled to a drain terminal 4. The memory cell 1 has a channel between the two regions and has a gate electrode 5 above that channel but insulated therefrom. The gate electrode 5 is connected to a gate terminal 6. The charge-trapping region is disposed between insulating layers, as explained in more detail below with reference to FIG. 3.

The arrangement comprises the programming signal generator 2, which is coupled to the drain terminal 4. The gate terminal 6 is at a fixed voltage. The source terminal 3 is coupled to a reference potential terminal 7. The programming signal generator 2 is designed to output, during a first period of time, a programming signal having a fixed voltage and to output, in a second period of time subsequent to the first period of time, a programming signal having a constant current, in each case for programming a first bit of the memory cell 1 by injecting and storing electrical charge in the charge-trapping region. The charge-trapping region with reference to the first bit of the cell is denoted by reference numeral 9. The program signal generator 2 further comprises means to measure the drain voltage during the second period of time, namely the constant current phase.

The program signal generator is designed to compare the actual drain voltage during the second period of time, reduced by the drain voltage during the constant voltage phase, with a predetermined threshold level of an amount of drain voltage increase, $\Delta V_D$. The predefined threshold level is defined as a function of a desired threshold voltage of the cell 1. According to the embodiment, the memory cell is a two-bit flash memory.

With reference to the circuit as shown in FIG. 1, the first bit, namely the so-called right bit of the cell can be programmed while the drain terminal is coupled to the programming signal source. The applied drain voltage is chosen such that hot carrier generation is possible. After the first period of time having the fixed voltage for hot carrier generation, the programming current is fixed and a change of the drain voltage is observed by the programming signal generator. By doing this, the initial value of the drain voltage is considered as an offset to be cancelled. For this reason, only the variation of the drain voltage is measured. The drain voltage slightly increases during the second period of time. This is due to the injected charges. The injected charges have an impact on the electrical shielding of the channel of the cell 1 close to the boundary. This is a second order effect but it is observable in the range of mV. When the predefined threshold level of an amount in change of drain voltage $\Delta V_D$ is exceeded, the program cycle is closed. In other words, the detection of a variation of the drain voltage can be interpreted as a reading of the bit being programmed of the two-bit flash memory cell as shown in FIG. 1. To read out this bit, the drain current is applied to the drain terminal.

By doing this, an adjustment of the threshold voltage of the memory cell regarding the bit being programmed is possible directly during programming. Therefore, a self-timing concept is provided. No testing steps are necessary to verify if the threshold voltage is, after applying a programming pulse, within desired upper and lower predefined levels. Instead, the drain voltage change is monitored directly during the second phase of the programming. By predefining a desired amount of variation of the drain voltage during the second phase, a desired threshold voltage of the memory cell can be set. This is very accurate so that no additional steps are necessary to test or verify. Therefore, the program time is sped up.

When having more than one memory cell, for example, with a memory array, it is possible to control the program cell distribution of the threshold voltage very easily according to the principle suggested above.

As an additional advantage, power saving is achieved during programming.

Figure 2:
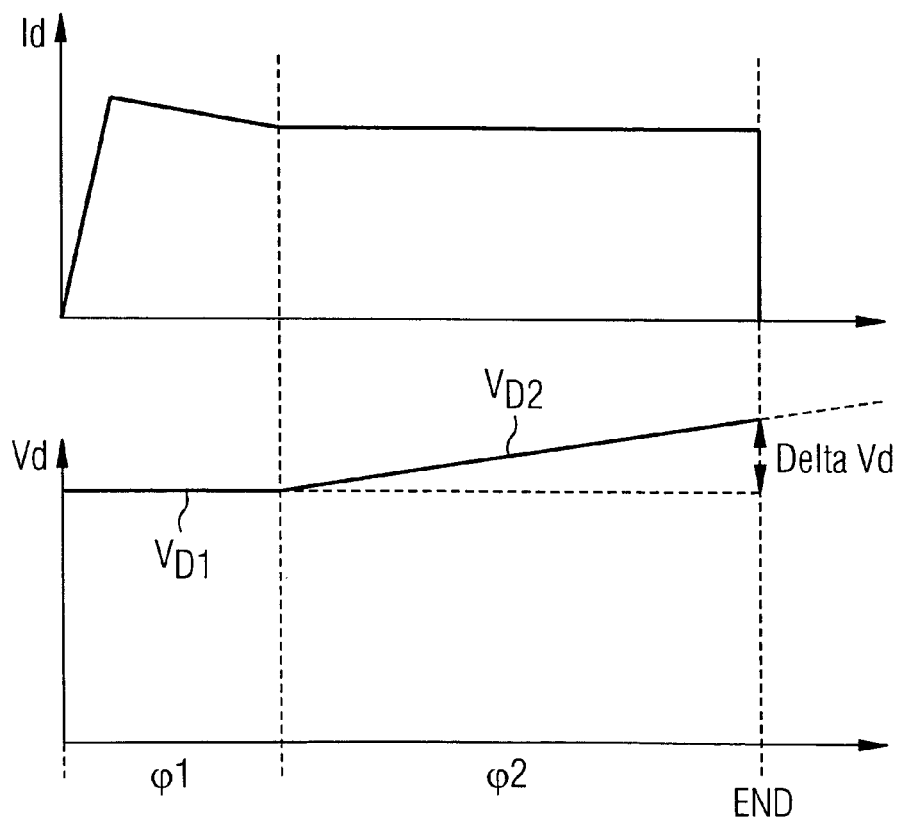
FIG. 2 is a diagram of the drain current and the drain voltage over time according to a first example.

FIG. 2 shows the diagram of an example of the drain current Id and the drain voltage Vd over time. During the first period of time $\phi 1$, the programming signal is a constant voltage signal. Therefore, during the first phase $\phi 1$, the drain voltage Vd is constant at a level VD1. During that first phase, the drain current Id rises very quickly until it reaches a maximum and then slowly drops. Before the desired programming of the cell would be finished, the first phase $\phi 1$ is ended and a second phase begins.

During the second phase $\phi 2$, the drain current level at the end of the first phase is fixed. This results in a constant drain current Id during the entire second phase. As a consequence of second order effects in the semiconductor memory cell, the drain voltage Vd slightly rises during the second phase $\phi 2$, the raising drain voltage referenced by VD2. Once as the difference between the variable drain voltage VD2 and the constant drain voltage VD1 exceeds a predetermined threshold $\Delta VD$, the programming is finalized. Due to the fact that the predetermined threshold level $\Delta VD$ represents a desired threshold voltage of the memory cell 1, a very accurate programming of a desired threshold voltage level is achieved.

Figure 3:
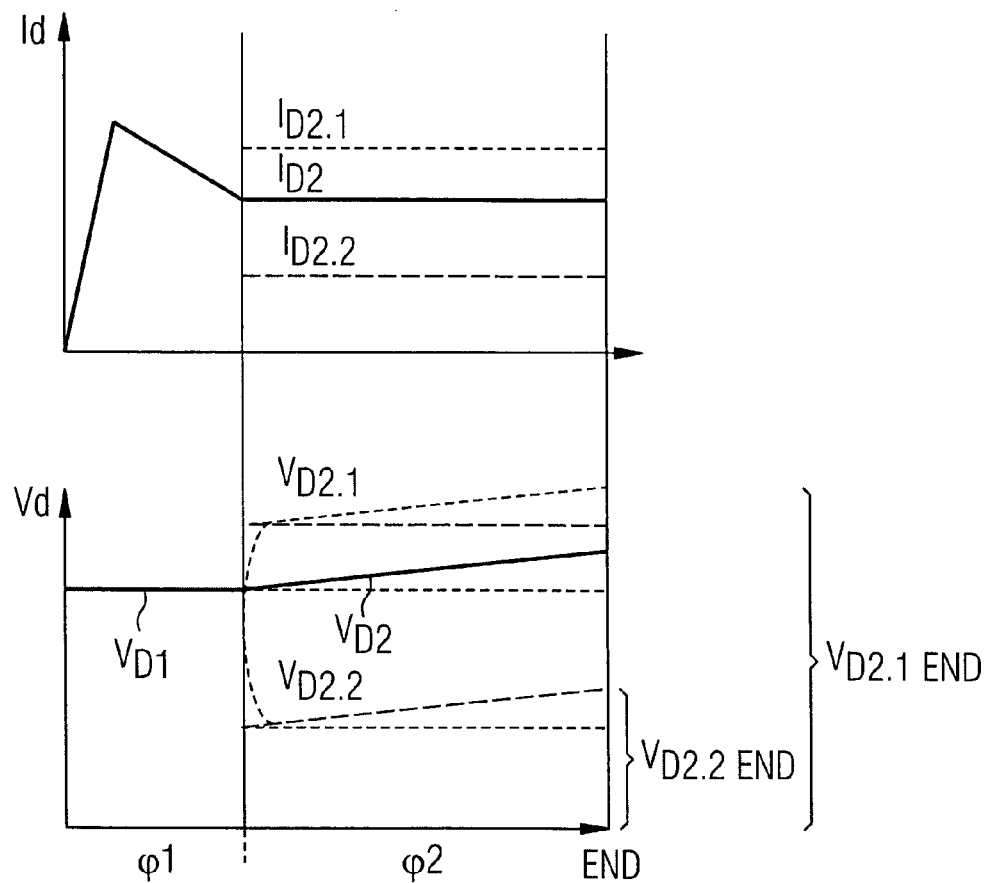
FIG. 3 is a diagram of the drain current and the drain voltage over time according to a second example.

FIG. 3 shows another example of the drain current Id and the drain voltage Vd over time. FIG. 3 differs from FIG. 2 in that not necessarily the drain current during the second phase $\phi 2$ corresponds to the current level reached at the end of the first phase $\phi 1$. Instead, at the end of the first phase $\phi 1$, it is possible to choose a constant current level ID2, ID2.1, ID2.2, that is greater than, equal to, or smaller than the current level ID2 reached at the end of the first phase $\phi 1$. The magnitude of the drain voltage VD2, VD2.1, VD2.2 during the second phase $\phi 2$ depends on the choice of the constant current level of the second phase $\phi 2$.

Figure 4:
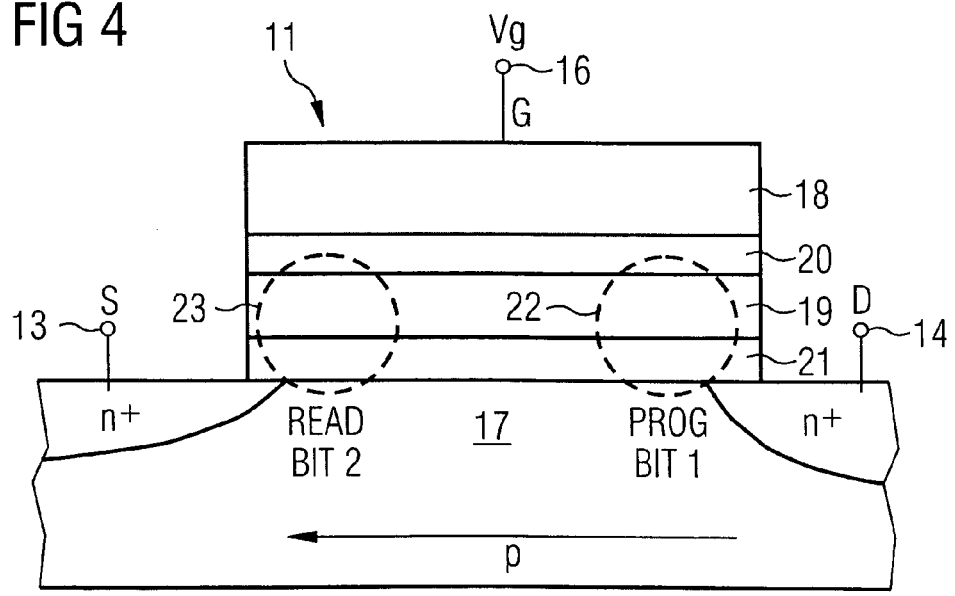
FIG. 4 shows an example of the structure of a two-bit flash EEPROM cell.

FIG. 4 shows an example of a structure of an integrated two-bit flash memory EEPROM cell 11. The memory cell 11 comprises a source terminal 13, a drain terminal 14, and a gate terminal 16. The memory cell 11 of FIG. 4 has a first region connected to the source terminal 13 and a second region connected to the drain terminal 14, the memory cell 11 having a channel 17 between the two regions. A gate electrode 18 is connected to the gate terminal 16 and placed above the channel 17. A charge-trapping region 19 is sandwiched between a first insulating layer 20 and a second insulating layer 21. According to the embodiment, an oxide-nitride-oxide, ONO structure is provided with layers 19 to 21. In the two-bit cell, the charge-trapping area can store, in a first region, a first bit 22 and, in a second region, a second bit 23. The first bit 22 is programmed in the direction from drain to source. To read the first bit, a reverse polarity has been applied from source to drain. The second bit can be programmed in a forward direction from source to drain. In a reverse direction, the second bit can be read out applying a signal from drain to source.

As for the same direction, during the second period of time, a reading of the bit being programmed can be performed during a programming of the first bit using a constant current signal and monitoring a change in drain voltage. Therefore, during the second period of time, when the programming current is fixed, a change of the drain voltage can be observed as a second order effect of the threshold voltage of the first bit.

Of course, the invention not only is applicable with two-bit NROM cells but also with single-bit cells, for example with flash memories having a floating gate structure. There, measurement of changes in the drain voltage even is easier because, instead of a second order effect, a variation in the programming voltage can be measured as a first order effect.

According to the embodiment, a measurement of a change in the transconductance is monitored.

Of course, the functions of drain and source can be exchanged to program the left bit and to read the right bit during the second period of time.

FIG. 5 shows an example of an embodiment of a programming signal generator according to the invention. At an output terminal 30 of the programming signal generator, a programming signal is provided. During a first phase φ1, a constant voltage generator 31 is connected via a switch 32 to the output 30. The constant voltage generator produces a constant drain voltage VD1. During the second phase φ2, the programming signal is a constant drain current, produced by a constant current generator 33. During this phase, the output 30 of the programming signal generator, which is coupled to the drain terminal of a memory cell, is also connected to measurement and comparison means. A first block 34 coupled to the output terminal 30 during the second phase φ2 reduces the measured drain voltage VD2 by the constant drain voltage VD1 provided by the constant voltage generator 31 during the first phase φ1. At the output of block 34, the amount of the drain voltage variation VD2-VD1 is provided. This value is compared, in a comparator 35, with a predefined threshold level ΔVD. If the output signal VD2-VD1 of block 34 exceeds the predefined threshold level ΔVD, then the programming step is finalized. This is, for example, performed by turning off the programming signal generator 30, 31, 32, 33, 34, 35.

FIG. 6 shows an alternative embodiment of a programming signal generator according to FIG. 5. In as far as the circuits of FIGS. 5 and 6 are identical, the description is not repeated here. With FIG. 6, block 34 is omitted. Instead, the output terminal of block 33 generating a constant current during the second phase, is directly connected to an input of comparator 35. Another input of comparator 35 is supplied with a reference threshold level of a drain voltage. This results in a comparison of the absolute value of the drain voltage level during the second phase with a predetermined threshold level. When the drain voltage to be measured exceeds the predetermined threshold level, the programming of the memory cell is finalized.

Of course, the circuits according to FIGS. 1 to 6 are only examples to better understand the invention. Modifications by a person skilled in the art are possible within the scope of the invention.

For example, drain and source terminals can be exchanged. Of course, the invention not only is applicable to a single bit or two bit memory cell, but also to arrays of memory cells in flash memory devices. The principle presented not only is applicable with a serial programming of several memory cells, but also with parallel programming of several cells a the same time, depending on the application.

What is claimed is:

1. A method of programming an electrically erasable programmable read-only memory cell capable of storing at least one information bit, said memory cell having a charge-trapping region, said method comprising:
    programming the information bit by injecting and storing electrical charge in the charge-trapping region by applying a programming signal having a fixed voltage to the memory cell during a first period of time;
    applying a programming signal having a constant current to the memory cell during a second period of time, said applied constant current resulting in said programming signal having a variable voltage at said memory cell;
    predefining a threshold value for said variable voltage;
    measuring said variable voltage at said memory cell during said second period of time;
    continuing applying said constant current programming signal to inject and store electrical charge in said charge trapping region such that said variable voltage increases;
    ending said injecting and storing when said variable voltage exceeds said predefined threshold value; and
    wherein the constant current applied during the second period of time is at a current level greater than, equal to, or smaller than, a current level reached at the end of the first period of time.

2. The method according to claim 1, wherein the constant current applied during the second period of time is at a current level equal to the current level reached at the end of the first period of time.

3. The method according to claim 1, wherein the constant current applied during the second period of time is at a current level smaller than the current level reached at the cud of the first period of time.

4. The method according to claim 1, further comprising measuring a change in voltage of a programming signal having the constant current during the second period of time.

5. The method according to claim 1, wherein the predefined threshold value is predefined as a function of a desired threshold voltage of the memory cell.

6. The method according to claim 4, wherein the step of programming the information, bit by injecting and storing electrical charge in the charge-trapping region is finalized when the absolute voltage level of the programming signal during the second period of time exceeds a predefined threshold value.

7. The method according to claim 4, wherein the electrically erasable programmable read-only memory cell is capable of storing two bits of binary information and wherein the measurement of the voltage change of the programming signal having the constant current is performed by reading the bit being programmed of the memory cell.

8. A circuit comprising:
    an electrically erasable programmable read-only memory cell capable of storing at least one information bit, said memory cell having a charge-trapping region;
    a programming signal generator coupled to the memory cell and designed to output, during a first period of time, a programming signal having a fixed voltage, and to output, during a second period of time subsequent to the first period of time, a programming signal having a constant current, whereby the programming signal generator causes programming of the information bit by injecting and storing electrical charge in the charge-trapping region;

a measuring device coupled to the memory cell to measure, during the second period of time, an increase in the voltage of the programming signal having a constant current as said injection and storage of electrical charge in said memory cell increases; and a comparator coupled to the measuring device and the memory cell, the comparator to compare an amount of said change in voltage of the programming signal having a constant current during the second period of time with a predetermined threshold level, wherein the programming of said memory cell is completed after the amount of said change in voltage of the programming signal during the second period of time exceeds the predetermined threshold level.

9. The circuit according to claim 8, wherein the programming signal generator is designed such that the constant current applied dining the second period of tin).e corresponds to the current level reached at the end of the first period of time.

* * * * *

UNITED STATES PATENT AND TRADEMARK OFFICE
CERTIFICATE OF CORRECTION

PATENT NO. : 7,274,597 B2
APPLICATION NO. : 11/141255
DATED : September 25, 2007
INVENTOR(S) : Srowik et al.

It is certified that error appears in the above-identified patent and that said Letters Patent is hereby corrected as shown below:

In Col. 8, line 33, delete "cud" and insert --end--.
In Col. 10, line 6, delete "dining" and insert --during--.
In Col. 10, line 6, delete "tin).e" and insert --time--.

Signed and Sealed this

Twenty-seventh Day of November, 2007

JON W. DUDAS
*Director of the United States Patent and Trademark Office*